United States Patent [19]

Bernstein

[11] Patent Number: 4,866,573
[45] Date of Patent: Sep. 12, 1989

[54] SURFACE MOUNTED COIL
[75] Inventor: Elliot Bernstein, Glen Cove, N.Y.
[73] Assignee: Bel Fuse, Inc., Jersey City, N.J.
[21] Appl. No.: 206,262
[22] Filed: Jun. 14, 1988

Related U.S. Application Data

[62] Division of Ser. No. 869,686, May 30, 1986, Pat. No. 4,759,120.

[51] Int. Cl.[4] .................. H05K 7/02; H01F 15/10
[52] U.S. Cl. .................... 361/400; 29/605; 29/840; 336/192; 336/205
[58] Field of Search ............ 29/605, 840, 602.1, 29/606; 336/192, 20 J, 208, 200, 225, 227, 228; 361/400, 405; 338/323, 325, 330

[56] References Cited

U.S. PATENT DOCUMENTS

| | | | |
|---|---|---|---|
| 3,008,108 | 11/1961 | Baker et al. | 29/605 |
| 3,196,523 | 7/1965 | Bell | 29/605 |
| 3,594,670 | 7/1971 | Weigel | 336/208 X |
| 3,824,518 | 7/1974 | Slenker | 29/602.1 X |
| 4,507,637 | 3/1985 | Hayashi | 336/192 X |

Primary Examiner—Carl E. Hall
Attorney, Agent, or Firm—Ostrolenk, Faber, Gerb & Soffen

[57] ABSTRACT

A coil is wound either with insulated wire or space wound with uninsulated wire and subsequently coated with a solder resist or insulating material. If insulated wire is used, the insulation is removed from the wire either during or after winding at predetermined locations to match the location of connection pads in a conductive pattern on a substrate. The coil is appropriately aligned and laid down on the substrate and an attachment technique is used to form an electrical connection between the exposed areas of wire and connection pads on the substrate. Alternatively, uninsulated wire may be used, which is space wound and coated with a solder resist or insulating material. The uninsulated wire may either be masked prior to coating or the insulating material may be removed following coating to form exposed connection locations on the coil corresponding to the location of the connection pads on the substrate. An attachment technique is then used to form an electrical connection between the exposed areas of wire and the corresponding connection pads on the substrate.

7 Claims, 5 Drawing Sheets

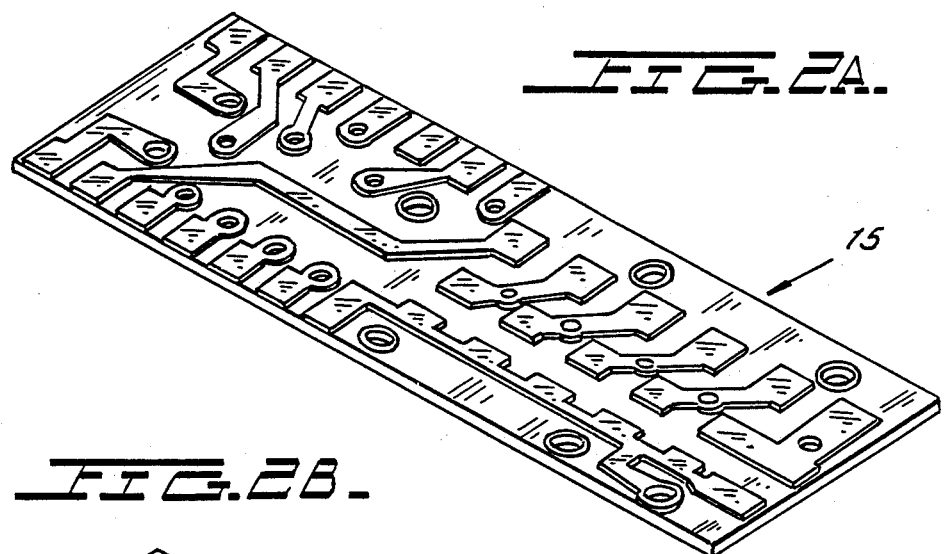
FIG. 2A.
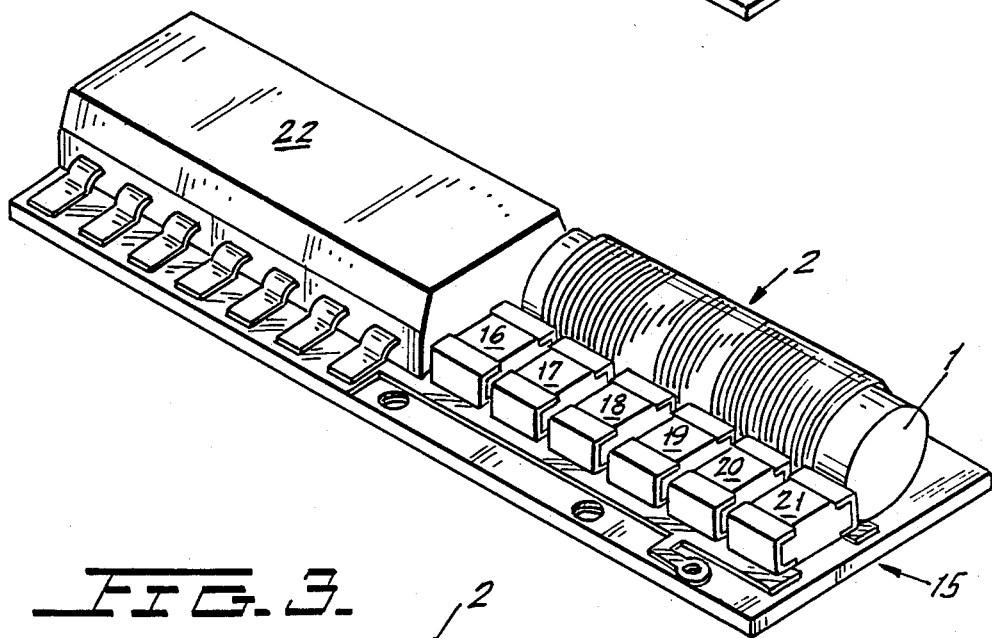
FIG. 2B.
FIG. 3.
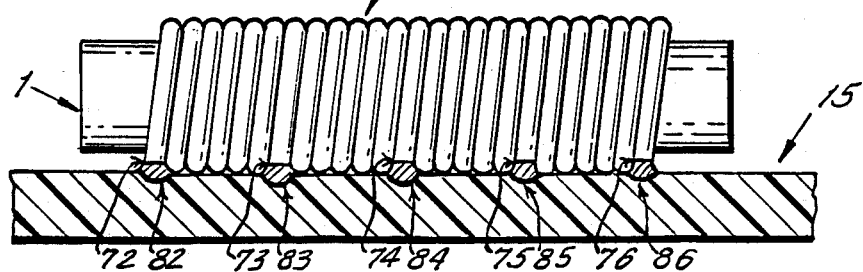

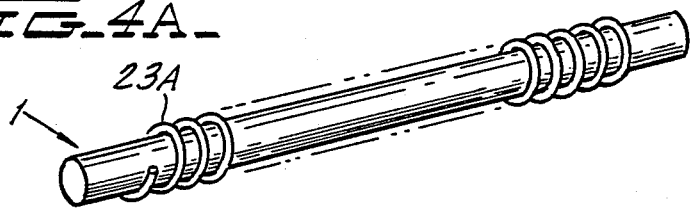
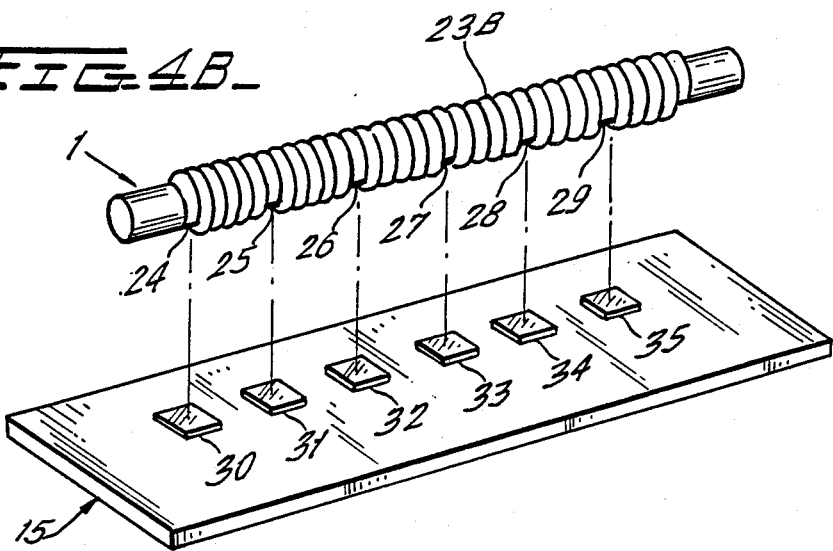
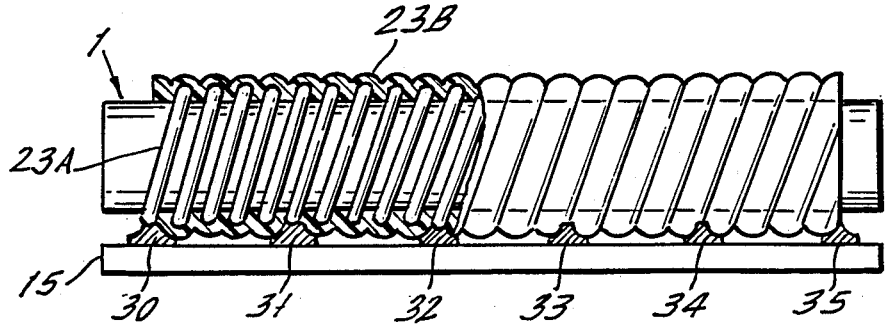

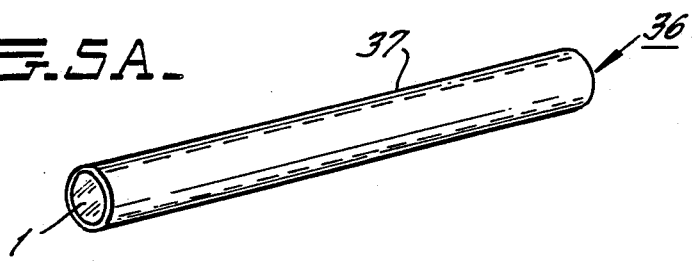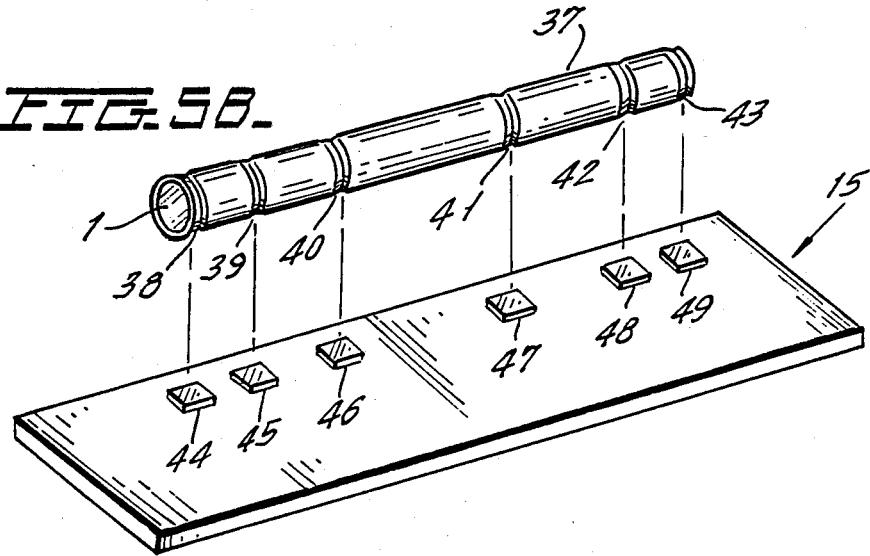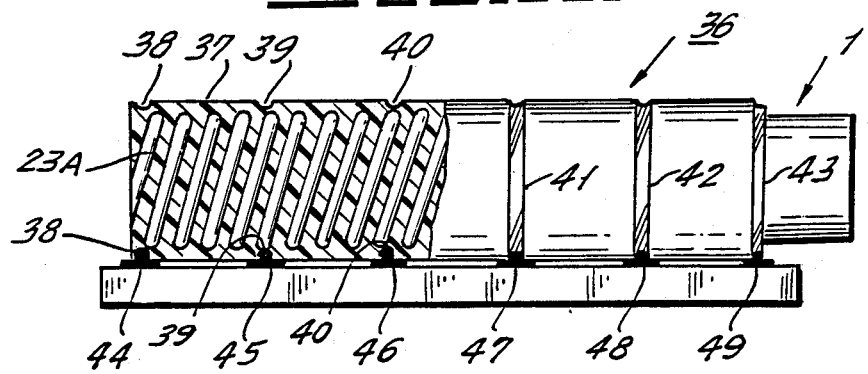

SURFACE MOUNTED COIL

CROSS REFERENCE TO RELATED APPLICATION

This is a division of application Ser. No. 869,686, filed May 30, 1986, now U.S. Pat. No. 4,759,120.

BACKGROUND OF THE INVENTION

The present invention relates to electrical coils and more particularly to a method of connecting electrical coils to a conductive circuit on a circuit board substrate.

In the construction and connection of electrical coils, such as inductances and resistances and especially delay lines, it is necessary in many cases to tap off from the coils at various points along the coil. The usual method for providing for such a tap off is, during the winding of a coil, to insert momentarily at the desired connection point in the winding a mechanical finger around which one or more of the coil turns will be taken and thereafter to remove the finger so that on the continuation of the winding the coil will be smooth until the finger is inserted at the next desired connection location. This method provides a loop or group of loops which may then be connected to electrical terminals, or other components on a circuit board.

In recent years, a new method of circuit board assembly utilizing surface mount components has come into increased acceptance. In this system of assembly, leadless components or components with specially formed leads are attached to connection locations on the circuit board.

Common attachment techniques include, but are not limited to, soldering, conductive epoxying, ultrasonic bonding, laser bonding, welding and mechanical contacting. Any device or process which will simplify the manufacture of circuit boards becomes extremely desirable since the saving of even minute amounts of material or time multiplies into substantial savings.

SUMMARY OF THE INVENTION

The present invention is directed to the construction of a coil and the mounting thereof so that minimal or no delay is incurred during the winding of the coil to pull taps, no additional structure need be made on the coil itself, no need the wire be pulled to create the start, finish and tap offs. The coil core may be comprised of any of the commonly used materials such as air, glass, ceramic, plastic, iron powder, or ferrite. The coil may either be wound with insulated wire, or space wound with uninsulated wire and subsequently appropriately coated with insulating material. Thereafter, in either case, the insulating material is removed at predetermined portions of the coil to match the start, finish and tap locations on the substrate that is at the ends as well as at intermediate locations along the coil.

Alternatively, if the coating technique is used, the desired configuration may be obtained by masking the coil at the desired start, finish and tap locations prior to applying the insulating material. This eliminates the step of later removing the insulating material.

Removal of the insulating material covering the wire may be accomplished either during or after winding of the coil. In any event, removal of the wire insulation, or if the coil has been space wound, removal of the insulating material coating the coil, may be done by any one of the numerous methods. Mechanical stripping or scraping, particle blasting (with or without a mask), application of heat (laser or flame), chemical means, and sanding, are all examples of such removal techniques.

The substrate may be provided with a conductive pattern having pads at the points where connections are to be made or with depressions at the same area, which depressions can retain a slight buildup of a solder bead. The coil, which has no insulation at the appropriate tap off locations, is laid down in appropriate alignment with the conductive pattern on the substrate. One of the aforementioned common attachment techniques, such as soldering, is then performed to make a connection from the uninsulated portions of the coil to the connection pads on the substrate.

Other features and advantages of the invention are described below with reference to the accompanying drawings.

BRIEF DESCRIPTION OF THE DRAWINGS

FIG. 2A shows a typical conductive pattern on a circuit board substrate. FIG. 2B shows the coil and other components mounted on the substrate.

FIG. 3 shows an embodiment of the invention in which the substrate is provided with depressions at the points where connection is to be made to the coil, and solder in each depression attaches the coil to the substrate.

FIGS. 4A, 4B and 4C show an embodiment of the invention in which an uninsulated coil of wire is coated with insulation and the insulation is either masked from the desired connection locations on the coil or the insulation is removed following coating.

FIGS. 5A, 5B and 5C shows an embodiment of the invention in which an uninsulated coil of wire is encapsulated with insulation and the insulation is either masked from the desired connection locations on the coil or the insulation is removed following encapsulation.

DETAILED DESCRIPTION OF THE PREFERRED EMBODIMENT

All of the below described cores for the coils and the coils are elongate with opposite axial ends.

Figure 1A:
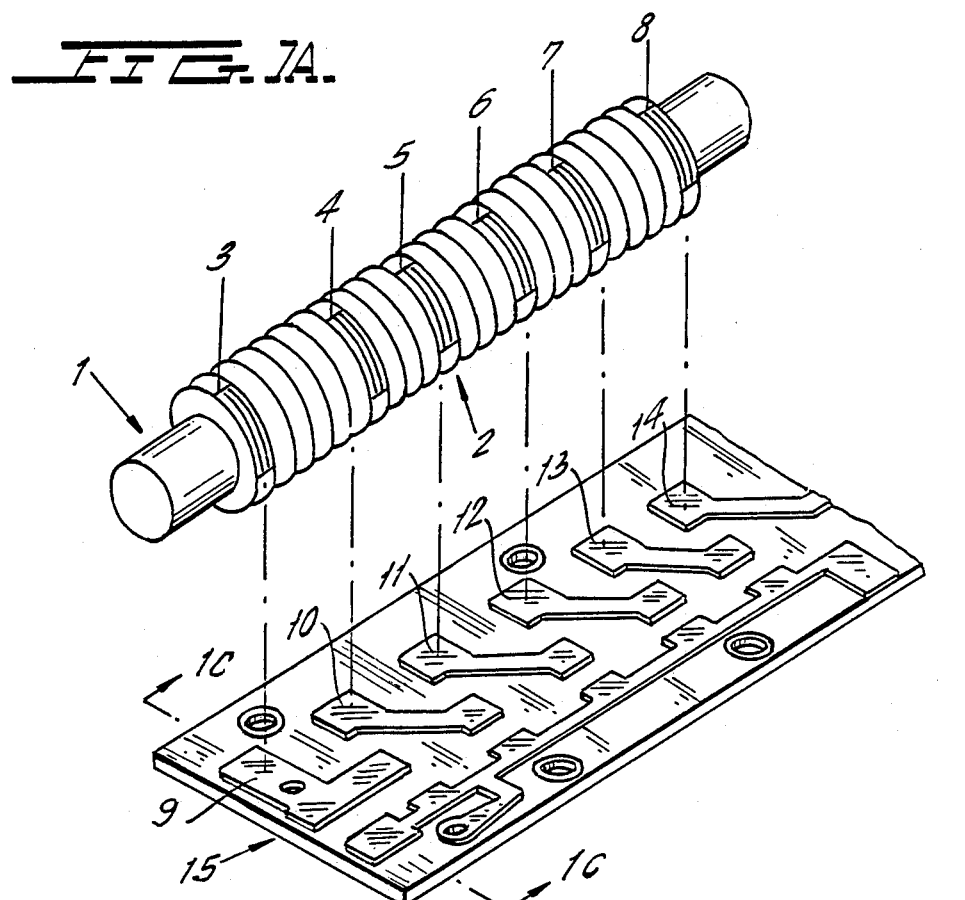
FIGS. 1A shows an embodiment of the invention in which insulated wire is used and the insulation is removed during or after winding.
Figure 1C:
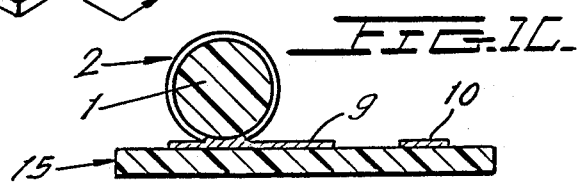
FIG. 1C shows a side cut-away view of the invention with the coil mounted on the substrate.
Figure 1B:
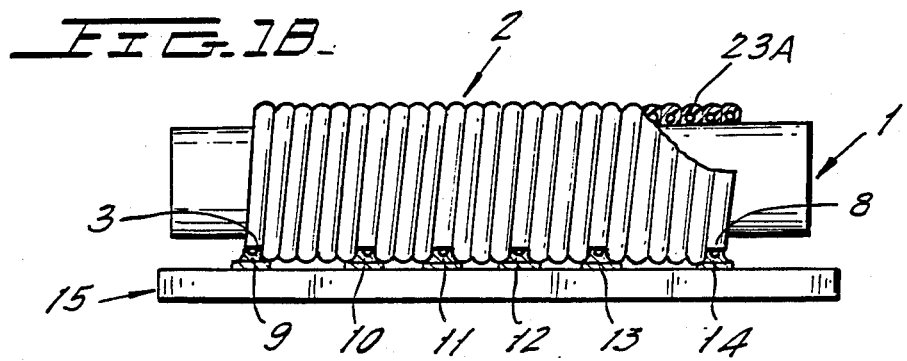
FIG. 1B shows a front view of the the invention with the coil mounted on the substrate.

Referring first to FIGS. 1A and 1B, an embodiment of the invention is shown in which a coil core 1 has been wound with insulated wire 2. The insulating material has been removed from the wire either during or after the winding process at precise areas 3, 4, 5, 6, 7, and 8 which correspond approximately to connection pad locations 9, 10, 11, 12, 13, and 14 on the printed circuit board substrate 15. In the former case, the insulation is removed from insulated wire 2 during the winding operation, just prior to the point at which the wire is wound around the coil core 1. Various means may be used to remove the insulation over a limited length of the insulated wire 2 so that when the wire is wound, an exposed portion of the wire is created for connection with the substrate. Among the various methods which may be used for removal of the insulation are mechanical scraping, sand blasting, or the application of heat in various forms, such as with a laser. As previously mentioned, the insulation is removed before the longitudinally moving wire reaches a coil form, and the length of the removal of insulation corresponds to the placement and width of the desired connection location along the core.

An alternative embodiment of the present invention involves removing the insulation from the wire after it has been wound around the core 1. Again, any of the various means for removing the insulation from the wire may be used. However, the preferred method is to remove the insulation from the wire as it is being wound into the coil form in order to obtain the most accurate and simple tap placement along the core.

An alternative method, if the winding length is short, or the diameter of the core is precisely controlled, or the connection pads on the substrate are wide enough to compensate for accumulated error due to core diameter tolerance, would be to remove the insulation on the wire at the start, finish and all tap locations before the wire is wound on the core. A still further alternative would be to wind aluminum wire around the core and to oxidize the aluminum as it is being wound to form a layer of insulation around the wire. The oxidation would be appropriately controlled during the winding of wire so that it is shut off, and no insulation is formed, at the points on the core where a tap location is desired.

Regardless of which method is followed, the exposed areas 3, 4, 5, 6, 7 and 8 of the insulated wire are lined up with the corresponding connection pads 9, 10, 11, 12, 13, and 14 on substrate 15. As shown in a front view in FIG. 1B and a side cut-away view in FIG. 1C, the core is placed onto the substrate with the exposed areas and connection pads in alignment and the exposed areas of the wire are attached to the corresponding pads on the substrate. Any of a variety of common attachment techniques may be used, such as soldering, conductive epoxying, ultrasonic bonding, laser bonding, welding and mechanical contacting. Thus, an electrical connection is made from the portions of the exposed wire to the appropriate connection pads.

FIG. 2A shows a typical conductive pattern on a circuit board substrate for integrated circuit components. FIG. 2B shows the coil of the present invention mounted on the circuit board substrate of FIG. 2A, along with chip capacitors 16-21 and integrated circuit chip 22.

Referring now to FIG. 3, the present invention may be mounted on a substrate 15 with depressions 82-86 instead of connection pads. During the soldering operation, beads of solder 72-76 trapped in each depression and by surface tension will rise sufficiently above the surface of substrate 15 so as to provide an appropriate solder connection to the exposed areas on insulated wire 2.

Referring now to FIGS. 4A, 4B and 4C, an alternative embodiment of the invention is shown In this embodiment, uninsulated wire 23A is space wound around a core 1 and then the entire core and uninsulated wire is coated with insulating material to form a coated coil 23B. At each of the points where connection from the core to the substrate is desired, the insulation or coating material is scraped off or removed following any of the removal techniques referred to above. As shown in FIGS. 4B and 4C, the insulation is removed from coated coil 23B at the precise areas 24-29 corresponding to the connection pads 30-35 on substrate 15. Alternatively, instead of scraping off the insulation following coating, the areas of wire to be exposed 24-29 may be masked prior to coating such that the insulation is absent from these areas.

In any event, again, the exposed areas 24-29 on the core are lined up with the connection pads 30-35 on the substrate 15, and an appropriate attachment technique, such as soldering, is used to couple the core 23 and substrate 15 together.

Referring to FIGS. 5A, 5B and 5C, a similar embodiment to that shown in FIGS. 4A, 4B and 4C is shown, except that the space wound coil 36 is fully encapsulated in insulating material 37, rather than simply coated with insulating material. Again, the tap offs 38-43 are created by following any of the removal techniques and an attachment is then made between the exposed areas of wire and the corresponding connection pads 44-49 on the substrate.

Figure 6A:
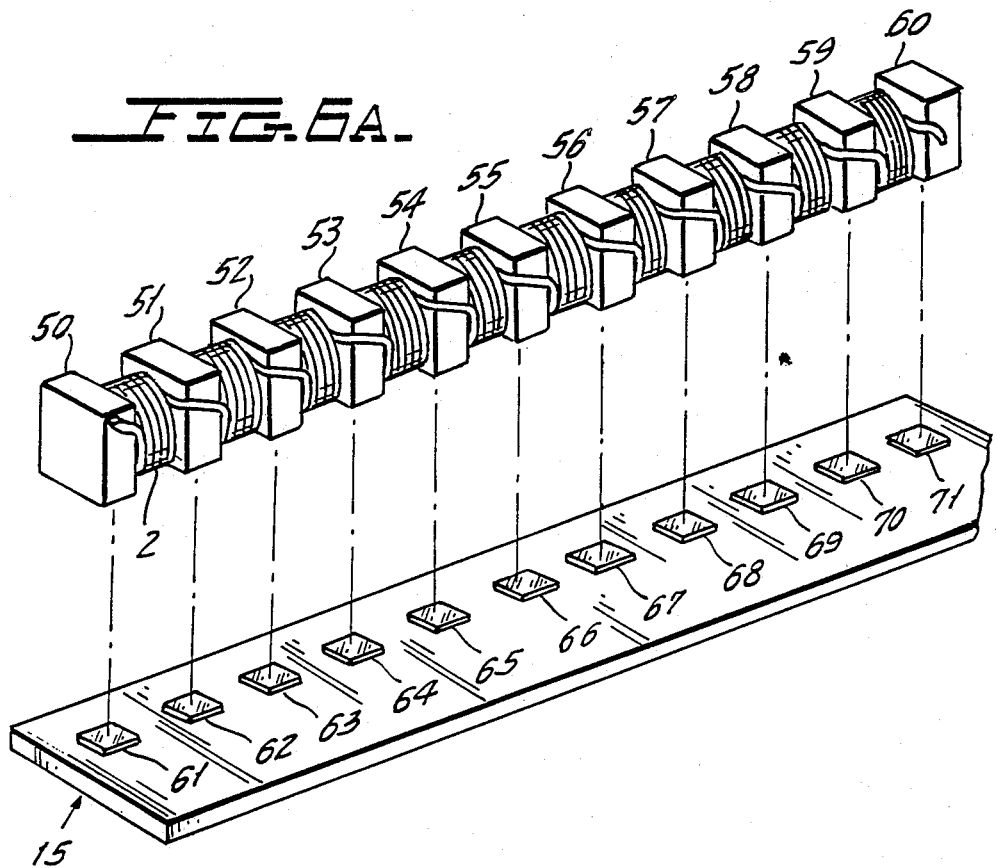
FIGS. 6A and 6B show an embodiment of the invention in which a series of flanges of insulating material are spaced at the desired connection locations on the coil core and the insulated coil wire is passed over the flanges, the insulation being removed from the wire at the flanges to create the desired connection locations.
Figure 6B:
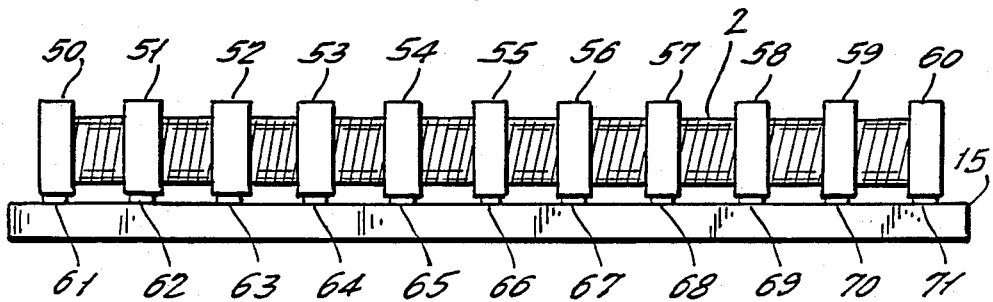

A still further embodiment of the invention shown in FIGS. 6A and 6B is called a multi-section flange bobbin or "comb bobbin". In this form of the invention, a series of square or round flanges 50-60 are spaced appropriately on the coil form. Insulated wire is then wound with a plurality of turns between the flanges 50-60 and continues from one space between a pair of flanges to the next adjacent space by carrying he insulated wire over the flange. A tap location is obtained by scraping or otherwise removing the insulation from the piece of coil wire that passes over each flange either during or after winding. The coil form is then rotated and positioned appropriately so that the exposed portions of the wire correspond to connection pads 61-71 on substrate 15. Alternatively, only the insulation passing over selected flanges may be removed to provide connection at only certain points among the core.

Although the present invention has been described in connection with a preferred embodiment thereof, many other variations and modifications will now becomes apparent to those skilled in the art. It is preferred, therefore, that the present invention be limited not by the specific disclosure herein, but only by the appended claims.

What is claimed is:

1. A coil and core assembly for mounting on a printed circuit board, comprising:
   an elongate, linear core having opposite axial ends; and
   an insulated wire coil spirally wound about the elongate core in a plurality of turns all of which are tightly wound around the core, wherein adjacent turns of the spirally wound wire coil are in contact; the wound wire extending from the vicinity of one axial end of the core to the vicinity of the other axial end of the core, and the wire having ends in the vicinities of the ends of the core; the assembly comprising the core with the wire wound about it having a mountable side for being mounted on a printed circuit board;
   the insulated wire having insulation thereof removed at longitudinally spaced locations along the spirally wound insulated wire, and each of the locations being on respective turns of the wire which are tightly wound on the core, and all of the locations being on the mountable side of the assembly, the locations including locations near the axial ends of the wire and including further tap off locations intermediate the axial ends of the wire, the locations corresponding to positions of connection pads on the circuit board on which the assembly is directly surface mounted and direct electrical connections are to be made from the pads to the wire at the respective locations along the wire.

2. In combination, the assembly of claim 1 and a printed circuit board, wherein the printed circuit board comprises a substrate for supporting the assembly and the assembly being mounted to the substrate at the mountable side of the coil;

the substrate having a conductive pattern thereon including a plurality of connection pads thereon for forming electrical connections, wherein the conductive pads are so placed on the substrate that there is a respective conductive pad thereon for each of the longitudinally spaced locations on the wire at which insulation has been removed; the assembly being surface mounted at the mountable side thereof on the circuit board and the locations being directly on the connection pads; and means effecting electrical connection between the connection pads and the respective locations along the wire.

3. The combination of claim 2, wherein the insulated wire is coated with insulation and at the longitudinal locations, the insulation coating is removed from the wire.

4. The combination of claim 2, wherein said connection pads comprise depressions in said printed circuit board.

5. The assembly as recited in claim 1, wherein said core has a plurality of longitudinally spaced flanges, said wire is passed over said flanges as it is wound around said core, and said insulation is removed at locations where said wire passes over said flanges.

6. The assembly as recited in claim 5, wherein said flanges are square.

7. The assembly as recited in claim 5, wherein said flanges are round.

* * * * *